US008805602B2

(12) United States Patent
Yun et al.

(10) Patent No.: US 8,805,602 B2
(45) Date of Patent: Aug. 12, 2014

(54) INVERTER APPARATUS AND ELECTRIC VEHICLE HAVING THE SAME

(75) Inventors: Junbo Yun, Seoul (KR); Jaeseok Oh, Seoul (KR); Heeseok Jeong, Seoul (KR); Junggi Lee, Seoul (KR); Sunkyoung Lim, Seoul (KR)

(73) Assignee: LG Electronics Inc., Seoul (KR)

( * ) Notice: Subject to any disclaimer, the term of this patent is extended or adjusted under 35 U.S.C. 154(b) by 215 days.

(21) Appl. No.: 13/229,974

(22) Filed: Sep. 12, 2011

(65) Prior Publication Data

US 2012/0253571 A1 Oct. 4, 2012

(30) Foreign Application Priority Data

Mar. 30, 2011 (KR) .................. 10-2011-0029067

(51) Int. Cl.
*B60L 11/00* (2006.01)
*H05K 7/20* (2006.01)

(52) U.S. Cl.
CPC ........ *H05K 7/20927* (2013.01); *H05K 7/20872* (2013.01)
USPC ............................ 701/22; 363/141; 180/65.31

(58) Field of Classification Search
USPC ............... 701/22; 180/65.275, 65.28, 65.285, 180/65.29, 65.31; 363/141
See application file for complete search history.

(56) References Cited

U.S. PATENT DOCUMENTS

| 6,000,912 A * | 12/1999 | Takada et al. .................. 417/32 |
|---|---|---|
| 2003/0127528 A1 | 7/2003 | Sabhapathy et al. |
| 2006/0001318 A1 * | 1/2006 | Ahmad et al. ............... 307/10.1 |
| 2008/0198548 A1 | 8/2008 | Nakamura et al. |
| 2008/0276632 A1 * | 11/2008 | Kumar ............................ 62/118 |
| 2008/0315736 A1 | 12/2008 | Yamada et al. |
| 2009/0099791 A1 * | 4/2009 | Zettel et al. ..................... 702/45 |
| 2010/0012295 A1 * | 1/2010 | Nemesh et al. .......... 165/104.19 |
| 2010/0025131 A1 * | 2/2010 | Gloceri et al. ............. 180/65.28 |
| 2011/0026226 A1 * | 2/2011 | Zheng et al. .................. 361/709 |

FOREIGN PATENT DOCUMENTS

| JP | 2009-177892 A | 8/2009 |
|---|---|---|
| JP | 2011-006050 A | 1/2011 |
| KR | 10-1998-028408 A | 7/1998 |

* cited by examiner

*Primary Examiner* — Joshua Rodden
(74) *Attorney, Agent, or Firm* — McKenna Long & Aldridge LLP

(57) ABSTRACT

An electric vehicle including an inverter which includes a plurality of elements to convert direct current power to alternating current power. The inverter includes first, second and third heat sinks to absorb heat within the inverter. The first, second, and third heat sinks including fluid passages therein to allow cooling fluid to pass through each of the heat sinks in parallel, wherein a controller controls the flow of the cooling fluid through each of the first, second and third heat sinks. Temperature sensors associated with each of the heat sinks allows the controller to control the flow of the cooling fluid to the corresponding heat sink. The inverter being part of a cooling fluid circulation circuit which includes a heater core which can transfer heat from the cooling fluid to a passenger space of a body of the vehicle.

10 Claims, 7 Drawing Sheets

INVERTER APPARATUS AND ELECTRIC VEHICLE HAVING THE SAME

CROSS-REFERENCE TO RELATED APPLICATIONS

The present disclosure relates to subject matter contained in priority Korean Application No. 10-2011-0029067, filed on Mar. 30, 2011, which is herein expressly incorporated by reference in its entirety.

BACKGROUND OF THE INVENTION

1. Field of the Invention

The present disclosure relates to an inverter apparatus and an electric vehicle having the same, and more particularly, to an inverter apparatus for cooling thermal radiation components as well as collecting heat, and an electric vehicle having the same.

2. Description of the Related Art

As is generally known, an inverter or inverter apparatus is an apparatus for converting direct-current power into high-frequency alternate-current power.

Such an inverter apparatus may be used in driving an induction heating apparatus or three-phase alternate-current motor for heating metal or the like using high-frequency power.

The inverter apparatus may include a case forming an accommodation space therein, and a circuit unit having a switching element disposed at an inner portion of the case to switch direct-current power to output high-frequency power.

Furthermore, the inverter apparatus may further include a cooling unit configured to dissipate and cool the heat generated by the circuit unit.

The cooling unit may further include a heat sink combined with the switching element to dissipate heat from the switching element.

On the other hand, in recent years, due to environmental pollution problems caused by the exhaust fumes of automobiles or vehicles, exhaustion of fossil fuels, and the like, the use of an electric vehicle or hybrid vehicle (hereinafter, also referred to as "electric vehicle") using an electromotor (electric motor) as the power source of an automobile or vehicle has been increased.

The electric vehicle may include a battery for supplying power to the electromotor and an inverter apparatus for receiving direct-current power from the battery to convert it into alternate-current power and supply three-phase alternate-current power to the electromotor.

The electric vehicle may include a cooling cycle apparatus for cooling and/or heating the air inside a vehicle.

For the cooling cycle apparatus, there may be used a so-called vapor compression cooling cycle including a compressor for compressing refrigerant, a condenser for heat-dissipating and condensing the refrigerant, an expansion apparatus for decompressing and expanding the refrigerant, and an evaporator for allowing the refrigerant to absorb and evaporate ambient latent heat.

However, in such an electric vehicle in the related art, the heat generated inside the case of the inverter apparatus may be dissipated to the outside of the case, and thus it may not be preferable in the aspect of energy consumption.

In particular, in case of heating the inside of the vehicle using electric energy (for example, in the winter season), battery consumption may be greatly increased.

In the winter season when the inside of the vehicle is heated using electricity, the consumption of the battery may be greatly increased, thereby remarkably reducing the mileage of the vehicle.

In the winter season when the inside of the vehicle is heated using electricity, the battery should be frequently charged. However, such charging takes long time, which cause the vehicle to be unusable at a proper timing.

SUMMARY OF THE INVENTION

In order to solve the foregoing problem, an aspect of the present disclosure is to provide an inverter apparatus capable of cooling the components as well as collecting thermal energy to use it in heating, and an electric vehicle having the same.

In addition, another aspect of the present disclosure is to provide an inverter apparatus capable of reducing battery consumption during heating and suppressing the reduction of mileage due to heating, and an electric vehicle having the same.

In order to accomplish the foregoing objectives of the present invention, there is provided an electric vehicle including a body, a plurality of wheels provided at the body, an electromotor to drive at least one wheel, a battery provided in the body, an inverter coupled between the battery and the electromotor, the inverter to convert direct current (DC) power to alternating current (AC) power, a first heat sink to absorb heat within the inverter, the first heat sink including a first cooling fluid passage therein to allow cooling fluid to pass through and exchange heat with the first heat sink, a second heat sink to absorb heat within the inverter, the second heat sink including a second cooling fluid passage therein to allow cooling fluid to pass through and exchange heat with the second heat sink; and a cooling fluid circulation circuit coupling the first cooling fluid passage of the first heat sink and the second cooling fluid passage of the second heat sink in parallel, and the cooling fluid circulation circuit including a heater core to transfer heat from the cooling fluid to a passenger space of the body.

Here, the first heat sink may be disposed to exchange heat with one or more elements of the inverter, and the second heat sink may be disposed to exchange heat with the first heat sink.

The electric vehicle may further include a controller, and the controller may control the flow of cooling fluid through the first cooling fluid passage of the first heat sink and the second cooling fluid passage of the second heat sink.

The electric vehicle may further include a first temperature sensor to sense a temperature associated with the first heat sink, and a second temperature sensor to sense a temperature associated with the second heat sink, and the controller may detect the temperature associated with the first heat sink using the first temperature sensor and detect the temperature associated with the second heat sink using the second temperature sensor.

The controller may reduce or suspend flow of the cooling fluid to the first cooling fluid passage when the controller detects that the temperature associated with the first heat sink is lower than a predetermined temperature, and the controller may reduce or suspend flow of the cooling fluid to the second cooling fluid passage when the controller detects that the temperature associated the second heat sink is lower than a predetermined temperature.

The electric vehicle may further include a third heat sink including a third cooling fluid passage therein, and the cooling fluid circulation circuit coupling the first cooling fluid passage of the first heat sink, the second cooling fluid passage of the second heat sink, and the third cooling passage of the third heat sink in parallel, wherein the controller controls the flow of cooling fluid through the first cooling fluid passage of the first heat sink, the second cooling fluid passage of the second heat sink, and the third cooling fluid passage of the third heat sink.

The electric vehicle may further include a first temperature sensor to sense a temperature associated with the first heat sink, a second temperature sensor to sense a temperature associated with the second heat sink, and a third temperature sensor to sense a temperature associated with the third heat sink, wherein the controller detects the temperature associated with the first heat sink using the first temperature sensor, detects the temperature associated with the second heat sink using the second temperature sensor, and detects the temperature associated with the third heat sink using the third temperature sensor.

The controller may reduce or suspend flow of the cooling fluid to the first and the second cooling fluid passage when the controller detects that the temperature associated with the third heat sink is higher than a predetermined temperature.

The controller may reduce or suspend flow of the cooling fluid to the second and the third cooling fluid passage when the controller detects that the temperature associated with the first heat sink is higher than a predetermined temperature.

The controller may reduce or suspend flow of the cooling fluid to the first and the third cooling fluid passage when the controller detects that the temperature associated with the second heat sink is higher than a predetermined temperature.

The electric vehicle may further include a radiator, and the controller may cause the cooling fluid to flow through at least one of the heating core and the radiator.

The controller may control between causing the cooling fluid to flow through the heater core and to flow through the radiator in order to suppress a temperature of the cooling fluid from increasing beyond a predetermined temperature.

At least a portion of the inverter may be insulated using an insulating material.

On the other hand, according to another aspect of the present invention, there is provided an inverter for use in an electric vehicle including a plurality of elements to convert direct current (DC) power to alternating current (AC) power, a first heat sink to absorb heat within the inverter, and the first heat sink including a first cooling fluid passage therein to allow cooling fluid to pass through and exchange heat with the first heat sink, and a second heat sink to absorb heat within the inverter, and the second heat sink including a second cooling fluid passage therein to allow cooling fluid to pass through and exchange heat with the second heat sink, wherein the first heat sink is disposed to exchange heat with at least one element of the inverter, and the second heat sink is disposed to exchange heat with the first heat sink.

Here, at least a portion of the inverter may be insulated using an insulating material.

The inverter may further include a first temperature sensor to detect a temperature associated with the first heat sink, and a second temperature sensor to detect a temperature associated with the second heat sink.

The inverter may further include a cooling fluid path coupling the first cooling fluid passage of the first heat sink and the second cooling fluid passage of the second heat sink.

The inverter may further include heat-dissipating fins disposed on at least one of the first heat sink and the second heat sink.

The inverter may further include a third heat sink including a third cooling fluid passage therein, and the third heat sink may be disposed between the first heat sink and the second heat sink.

The inverter may further include a third temperature sensor to detect a temperature associated with the third heat sink.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Hereinafter, the present invention will be described in detail with reference to the accompanying drawings.

Figure 1:
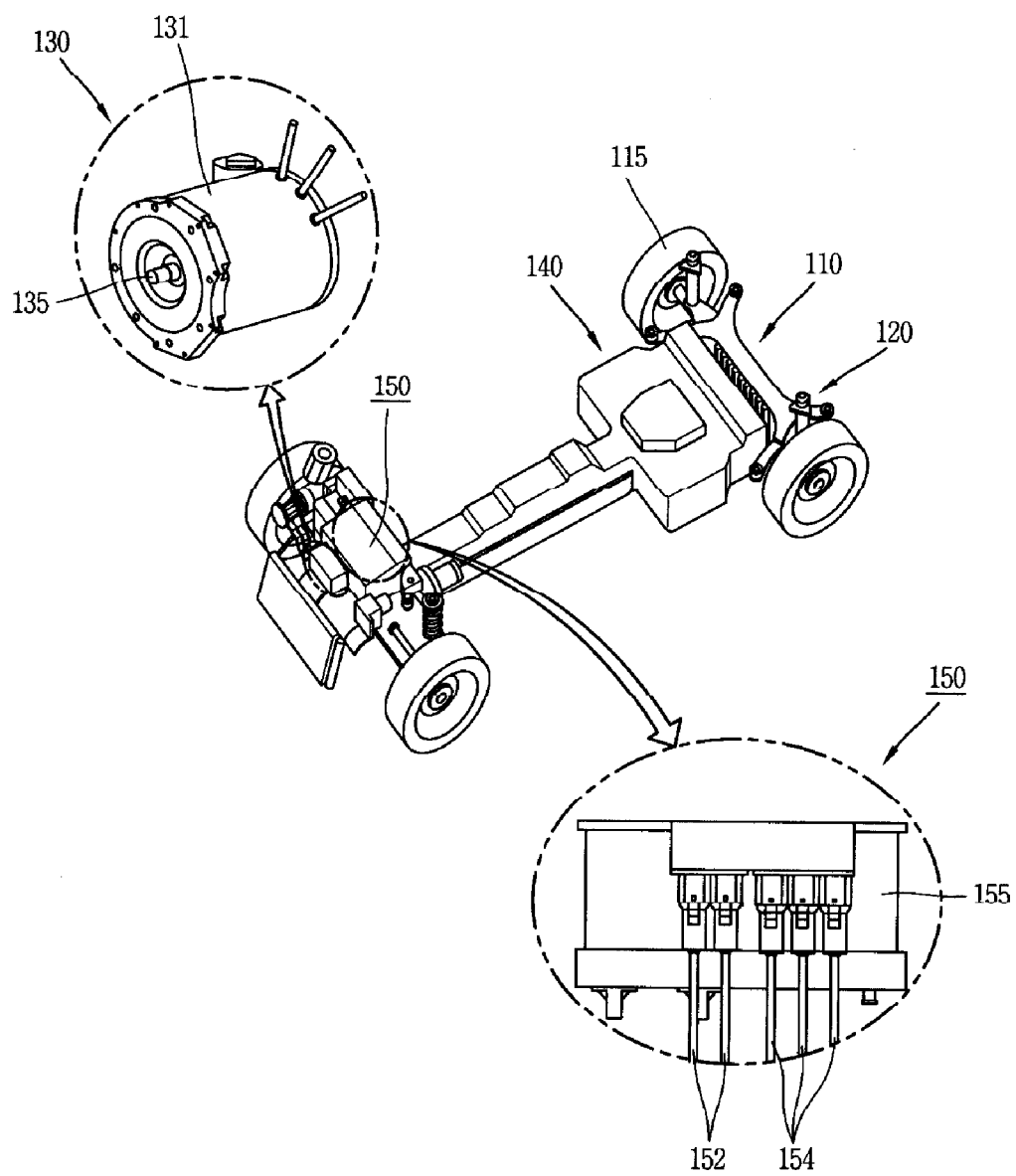
FIG. 1 is a schematic configuration diagram illustrating an electric vehicle having an inverter apparatus according to an embodiment of the present invention.

As illustrated in FIG. 1, an electric vehicle having an inverter apparatus according to an embodiment of the present disclosure may include a body or car body 110, a wheel 115 provided in the car body 110, an electromotor 130 configured to drive the wheel 115, a battery 140 provided in the car body 110, and an inverter apparatus 150 connected to the battery 140 and electromotor 130, respectively, to supply drive power to the electromotor 130.

A passenger space for allowing a driver and/or a passenger to get on, though not shown in the drawing, may be provided at an upper region of the car body 110.

A plurality of wheels 115 for driving a vehicle may be provided in the car body 110.

The plurality of wheels 115 may be provided at both front and rear sides of the car body 110.

A suspension device 120 may be provided between the car body 110 and the wheel 115 to absorb vibration and/or shock generated while driving a road.

A battery 140 for supplying direct-current power may be provided in the car body 110.

The battery 140 may be configured with a secondary battery capable of charging and discharging.

An electromotor 130 may be provided at a side of the wheel 115 to provide a driving force to the wheel 115. The electromotor 130 may be configured with a three phase alternate-current electromotor being operated with three phase alternate-current power.

The electromotor 130 may include a frame 131 provided with an accommodation space therein, a stator (not shown) disposed within the frame 131, a rotor (not shown) rotatably disposed around a rotation shaft 135 with respect to the stator.

A gearbox (not shown) for transmitting a rotational force to the wheel 115 with a predetermined gear ratio may be provided at an output end portion of the rotation shaft of the electromotor 130.

An inverter apparatus 150 for converting the direct-current power of the battery 140 into alternate-current power to output the alternate-current power may be provided between the electromotor 130 and the battery 140.

A plurality of input cables 152 for receiving direct-current power and a plurality of output cables 154 for outputting drive power (alternate-current power) may be provided at a side of the inverter apparatus 150.

Figure 2:
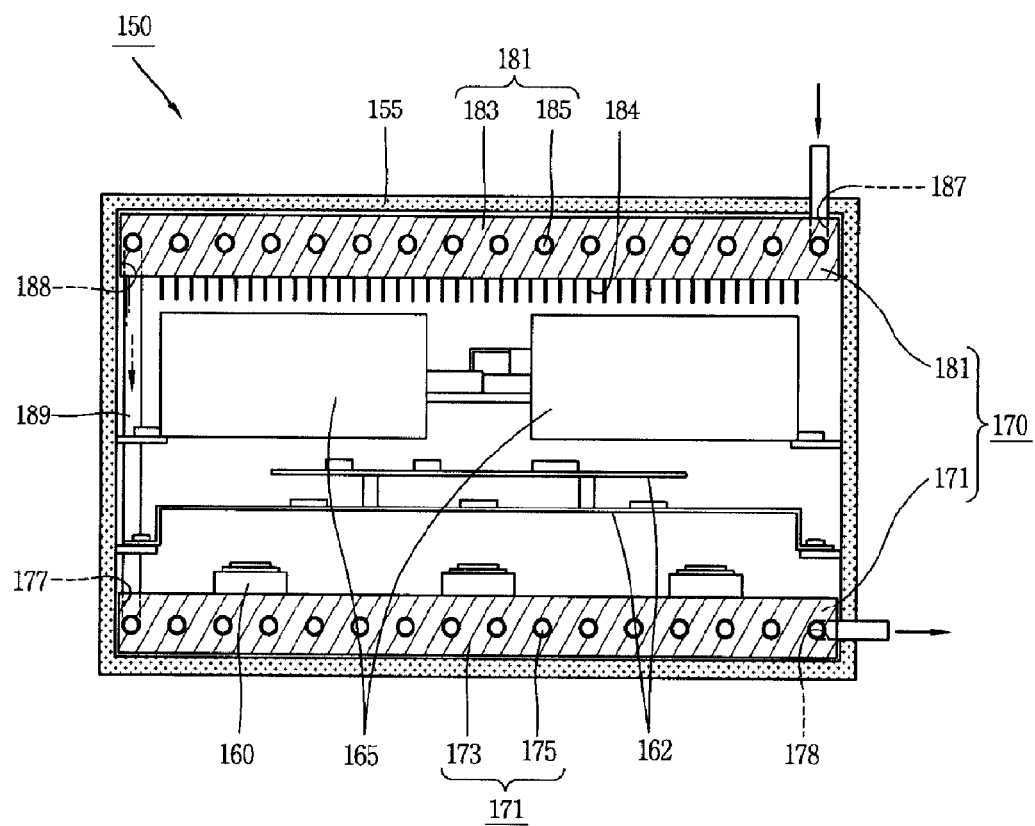
FIG. 2 is a cross-sectional view illustrating the inverter apparatus of FIG. 1.

On the other hand, the inverter apparatus 150, as illustrated in FIG. 2, may include a case 155, a switching element 160 disposed within the case 155, a first heat sink 171 provided with a cooling fluid passage therein and disposed to exchange heat with the switching element 160, and a second heat sink 181 disposed to exchange heat with the first heat sink 171.

The case 155 may be formed with a rectangular parallelepiped formed with an accommodation space therein.

The case 155 may be formed of an insulating material. Due to this, it may be possible to suppress thermal energy within the case 155 from being dissipated to the outside.

A plurality of switching elements 160 may be provided within the case 155.

The switching element 160 may be configured with an insulated gate bipolar transistor (IGBT).

The switching elements 160 may be disposed at an inner lower region of the case 155.

A printed circuit board (hereinafter, referred to as "PCB") 162 may be provided at an upper side of the switching element 160.

A plurality of PCBs 162 may be configured therein. The PCBs 162 may be disposed to be vertically separated from one another with a predetermined distance.

A DC-link capacitor 165 may be provided within the case 155 to remove noise in the direct-current power supplied from the battery 140 and provide the noise-removed direct-current power to the switching element 160. The DC-link capacitor 165 may be provided at an upper side of the PCB 162.

On the other hand, a heat sink 170 may be provided within the case 155 to cool the inside of the case 155. More specifically, the heat sink 170 may be provided to cool an internal space and/or a component (for example, switching element) of the case 155. A plurality of heat sinks 170 may be provided therein.

For example, the heat sink 170 may include a first heat sink 171 provided with a cooling fluid passage 175 therein and disposed to exchange heat with the switching element 160 and a second heat sink 181 disposed to be separated from the first heat sink 171 within the case 155. Due to this, it may be possible to quickly cool the inside of the case 155.

The first heat sink 171 as a thermal conductive member may be formed with a substantially rectangular plate shape. The first heat sink 171 may be formed in a substantially same size (width and length) as that of the internal space of the case 155. As a result, the heat exchange area of the first heat sink 171 may be increased, thereby quickly cooling the switching elements 160.

The first heat sink 171 may include a body 173 formed with a thermal conductive member, and a passage 175 formed within the body 173 to flow a cooling fluid.

The passage 175 may be formed to have a zigzag-shaped cross section. A cooling fluid inlet 177 may be formed at a side of the first heat sink 171 to inhale a cooling fluid. A cooling fluid outlet 178 may be formed at the other side of the first heat sink 171 to discharge the cooling fluid.

The second heat sink 181 may be disposed at an upper region of the inner space of the case 155. As a result, an upper region of the inner space of the case 155 having a relatively high temperature may be quickly cooled by convective phenomenon.

The second heat sink 181 may include a body 183 formed of a thermal conductive member and a passage 185 formed within the body 183 to flow a cooling fluid.

A cooling fluid inlet 187 may be formed at a side of the second heat sink 181 to inhale a cooling fluid and a cooling fluid outlet 188 may be formed at the other side of the second heat sink 181 to discharge the cooling fluid.

The second heat sink 181 may be provided with a plurality of heat-dissipating fins 184 protruded from a surface thereof. Due to this, a surface area of the second heat sink 181 may be increased, thereby promoting heat exchange with the air within the case 155. The heat-dissipating fins 184 may be formed to be protruded downward at a bottom surface of the second heat sink 181.

A connecting pipe 189 for connecting a passage 175 of the first heat sink 171 and a passage 185 of the second heat sink 181 to be communicated with each other may be provided between the second heat sink 181 and the first heat sink 171. Due to this, the second heat sink 181 and the first heat sink 171 may be configured with a single passage.

More specifically, an end portion of the connecting pipe 189 may be connected to the cooling fluid outlet 188 of the second heat sink 181 and the other end portion of the connecting pipe 189 may be connected to the cooling fluid inlet 177 of the first heat sink 171. As a result, the cooling fluid, first, may cool the second heat sink 181 while passing through the second heat sink 181, and then move to the first heat sink 171 to cool the first heat sink 171.

On the other hand, an electric vehicle having the inverter apparatus 150 may include a cooling fluid circulation circuit 210 for allowing a cooling fluid to be circulated while passing through the inverter apparatus 150.

Figure 3:
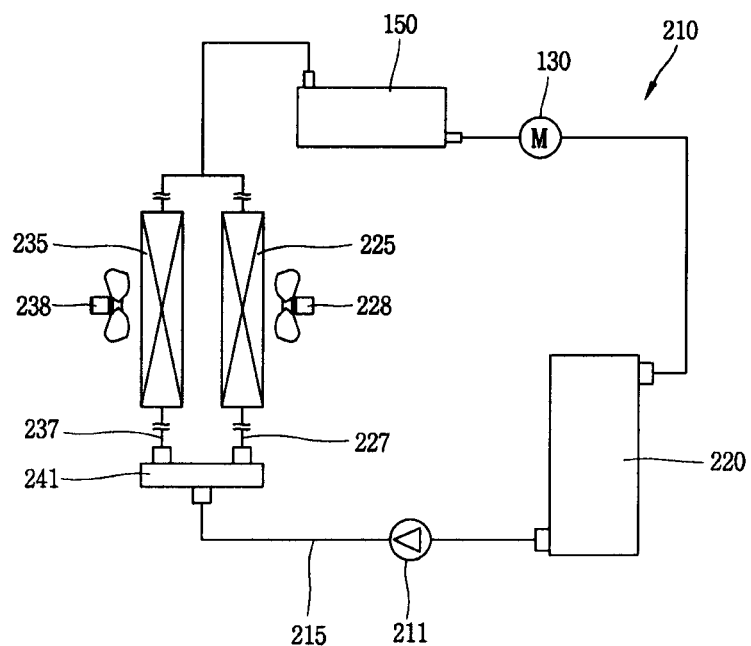
FIG. 3 is a configuration diagram illustrating a cooling passage of the electric vehicle of FIG. 1.

The cooling fluid circulation circuit 210, as illustrated in FIG. 3, may include a pump 211 for pumping a cooling fluid to be circulated, and a fluid pipe 215 for forming a passage to move the cooling fluid.

More specifically, the cooling fluid inlet 187 of the second heat sink 181 and the cooling fluid outlet 178 of the first heat sink 171 may be connected to the cooling fluid circulation circuit 210, respectively. As a result, the cooling fluid pumped by the pump 211 may flow through the second heat sink 181, the connecting pipe 189, and the first heat sink 171 in the inverter apparatus 150.

A tank 220 may be provided at a side of the pump 211 (for example, an upstream side or inlet side of the pump 211). An accommodation space for temporarily accommodating the cooling fluid may be provided within the tank 220.

The cooling fluid circulation circuit 210 may be configured to allow the cooling fluid that has passed through the inverter apparatus 150 to pass through the electromotor 130. Due to this, the electromotor 130 may be cooled by the cooling fluid that has passed through the inverter apparatus 150. As a result, heat (thermal energy) may be collected while cooling the electromotor 130 as well as the inverter apparatus 150, thereby collecting more thermal energy.

A radiator 225 may be provided in the cooling fluid circulation circuit 210 to cool a cooling fluid. A cooling fan 228 may be provided at a side of the radiator 225 to ventilate air to the radiator 225, thereby cooling the radiator 225.

On the other hand, a heater core 235 may be provided in the cooling fluid circulation circuit 210 to use the heat collected from the heat sink 170 while passing through the inverter apparatus 150.

The heater core 235 may be disposed at a region being communicated with a passenger space of the car body 110. A ventilation fan 238 may be provided at a side of the heater core 235 to ventilate air to the passenger space. As a result, the air with an increased temperature while passing through the heater core 235 may be ventilated to the inside of the vehicle.

A first branch pipe 227 may be connected to the radiator 225.

The first branch pipe 227 may be connected to an inlet side of the cooling fluid of the radiator 225.

A second branch pipe 237 may be connected to the heater core 235.

The second branch pipe 237 may be connected to an inlet side of the cooling fluid of the heater core 235.

The first branch pipe 227 and second branch pipe 237 may be connected to a passage change valve 241.

The passage change valve 241 may be provided with a plurality of ports.

A port of the passage change valve 241 may be connected to the pump 211. Due to this, it may be possible to control the passage of the cooling fluid being pumped and circulated by the pump 211.

On the other hand, an electric vehicle having the inverter apparatus may be configured to have the controller 250 with a control program.

The controller 250, for example, may be implemented with a microprocessor having a control program to be mounted on the PCB 162.

The controller 250 may be configured to change a passage of the cooling fluid according to the selected operation mode such as cooling or heating inside a vehicle.

Figure 4:
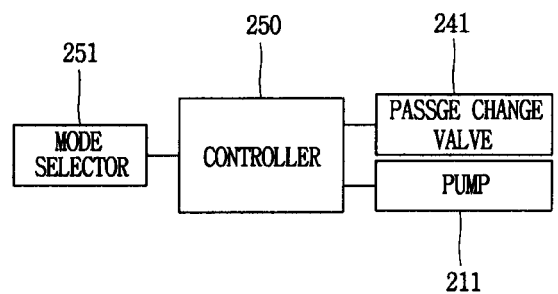
FIG. 4 is a control block diagram illustrating the electric vehicle of FIG. 1.

As illustrated in FIG. 4, a mode selector 251 for selecting an operation mode may be connected to the controller 250.

A passage change valve 241 for changing a passage of the cooling fluid may be controllably connected to the controller 250. As a result, the cooling fluid may be passed through the radiator 225 to cool the inside of the vehicle, or passed through the heater core 235 to heat the inside of the vehicle (specifically, a passenger space of the car body 110).

The pump 211 may be controllably connected to the controller 250 to control a flow speed of the cooling fluid. The controller 250 may increase the flow speed of the cooling fluid by increasing the rotation number of the pump 211.

By this configuration, heat (or thermal energy) is generated when starting the operation of the switching element 160 in the inverter apparatus 150. The controller 250 may control the pump 211 to allow the cooling fluid to be circulated along the cooling passage.

Part of the heat generated by the switching element 160 may be transferred to the first heat sink 171, and another part thereof may be generated upward. The dissipated heat may be moved to an inner upper region of the case 155 by convective phenomenon. Here, the case 155 is formed of an insulating material, and thus the heat inside the case 155 may not be dissipated to the outside but may be heat-exchanged with the cooling fluid to collect more thermal energy.

On the other hand, the cooling fluid inhaled into the passage 185 through the cooling fluid inlet 187 of the second heat sink 181 may be heat-exchanged with the second heat sink 181 while flowing along the passage 185 of the second heat sink 181. As a result, it may be possible to cool the second heat sink 181.

The cooling fluid that has passed through the second heat sink 181 may be inhaled into the passage 175 of the first heat sink 171 through the connecting pipe 189. The cooling fluid that has inhaled into the first heat sink 171 may be heat-exchanged with the first heat sink 171 while flowing along the passage 175. As a result, it may be possible to cool the switching elements 160 and the first heat sink 171.

The cooling fluid with an increased temperature that has passed through the first heat sink 171 may cool the electromotor 130 while passing through the electromotor 130 with a relatively higher temperature.

The cooling fluid that has passed through the electromotor 130 may be temporarily stored inside the tank 220.

The cooling fluid inside the tank 220 may be pumped by the pump 211 to be circulated along a cooling passage formed within the fluid pipe 215.

On the other hand, if heating (mode) is selected by the mode selector 251, then the controller 250 may control the passage change valve 241 to flow the cooling fluid while passing through the heater core 235. The cooling fluid moved to the heater core 235 may be heat-exchanged with the air inside a vehicle. The air inside the vehicle with an increased temperature may be ventilated into the vehicle to heat the inside of the vehicle (a passenger space of the car body 110).

The inside of the vehicle can be heated while alternately performing the process of moving the cooling fluid to the heater core 235 and exchanging heat with the air inside a vehicle to reduce the temperature, and the process of exchanging heat with the heat sink 170 in the inverter apparatus 150 to increase the temperature.

When the heating mode is not selected, the controller 250 may control the passage change valve 241 to allow the cooling fluid to be passed and circulated through the radiator 225. Due to this, the cooling fluid may be cooled to reduce the temperature.

Furthermore, the controller 250 may alternately repeat the process of moving the cooling fluid the radiator 225 and exchanging heat with the air in a vehicle to reduce the temperature, and the process of moving the cooling fluid to the inverter apparatus 150 and exchanging heat with the heat sink 170 to increase the temperature. Due to this, the temperature of the inverter apparatus 150 may be suppressed from being excessively increased.

Hereinafter, an inverter apparatus according to another embodiment of the present invention will be described with reference to FIGS. 5 through 7.

For the sake of brevity of explanation, the same or similar elements as the foregoing configuration are designated with the same numeral references and their detailed redundant description regarding some of the configuration and operation will be omitted.

As described above, an electric vehicle having an inverter apparatus according to this embodiment may include a car body 110, a wheel 115 provided in the car body 110, an electromotor 130 configured to drive the wheel 115, a battery 140 provided in the car body 110, and an inverter apparatus 150 connected to the battery 140 and electromotor 130, respectively, to supply drive power to the electromotor 130.

Figure 5:
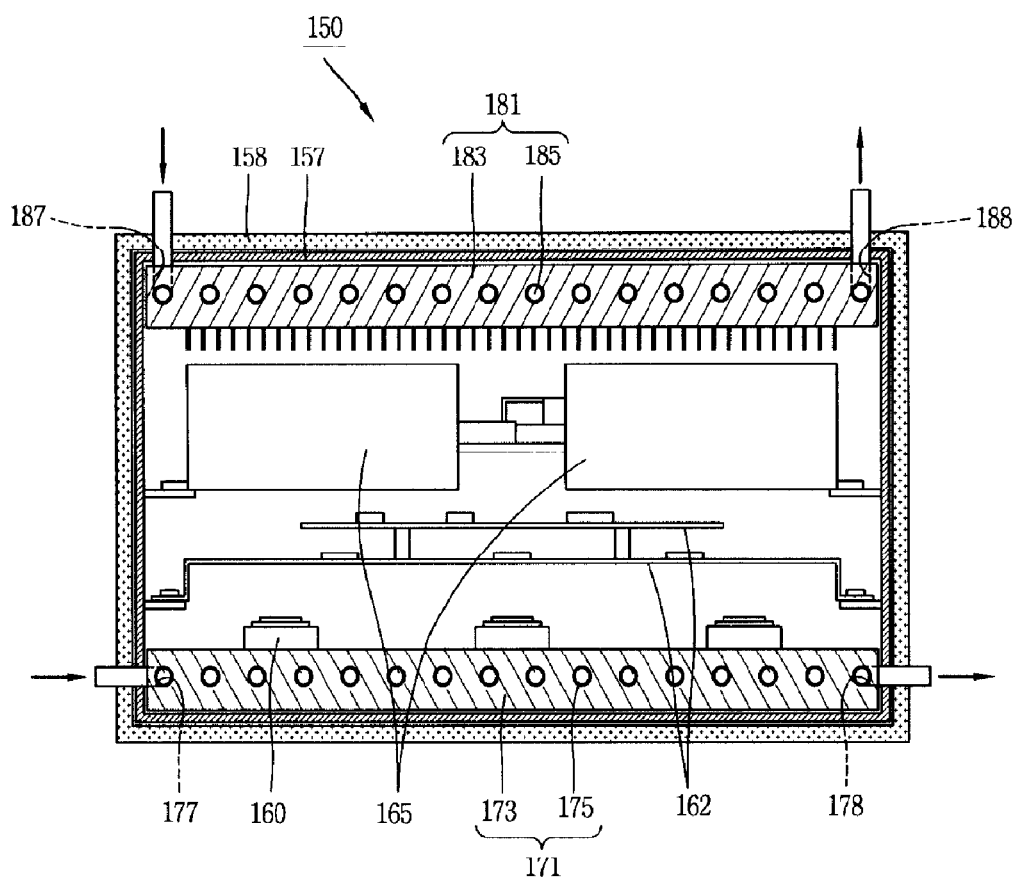
FIG. 5 is a cross-sectional view illustrating an inverter apparatus of an electric vehicle according to another embodiment of the present invention.

As illustrated in FIG. 5, the inverter apparatus 150 may include a case 157, a switching element 160 disposed within the case 157, a first heat sink 171 provided with a cooling fluid passage therein and disposed to exchange heat with the switching element 160, and a second heat sink 181 disposed to exchange heat with the first heat sink 171.

The case 157 may be formed with a rectangular parallel-epiped formed with an accommodation space therein.

An insulating material 158 surrounding an outer surface of the case 157 may be provided at an outer portion of the case 157. Due to this, it may be possible to suppress heat (thermal energy) within the case 157 from being dissipated to the outside.

On the other hand, a plurality of switching elements 160 may be provided within the case 157.

The switching element 160 may be disposed at an inner lower portion of the case 157.

The first heat sink 171 may be disposed in a heat-exchanging manner at a lower side of the switching element 160. Due to this, it may be possible to quickly cool the switching element 160.

The first heat sink 171 may include a body 173 formed with a thermal conductive member, and a passage 175 formed within the body 173. The switching elements 160 may be combined with an upper surface of the body 173 in a heat-exchanging manner. The body 173 may be provided with a cooling fluid inlet 177 and a cooling fluid outlet 178, respectively.

A plurality of PCBs 162 may be provided at an upper side of the switching element 160.

A DC-link capacitor 165 may be disposed at an upper side of the PCB 162.

The second heat sink 181 may be provided at an upper side of the DC-link capacitor 165.

The second heat sink 181 may include a body 183 formed of a thermal conductive member and a passage 185 formed within the body 183. A plurality of heat-dissipating fins 184 may be formed at a bottom portion of the body 183 to be protruded downward. Due to this, it may be possible to more quickly cool an inner upper region of the case 157.

The body 183 of the second heat sink 181 may be provided with a cooling fluid inlet 187 and a cooling fluid outlet 188, respectively.

Figure 6:
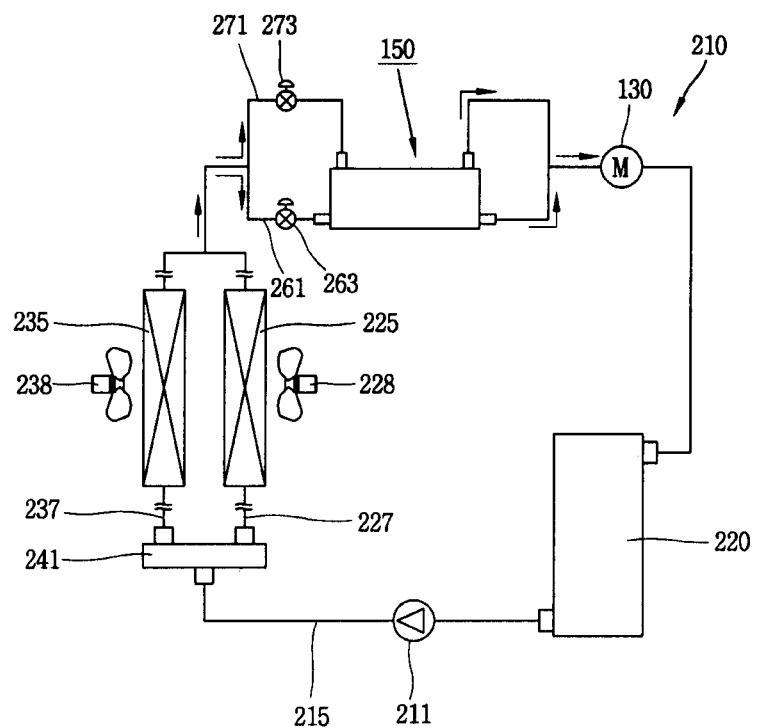
FIG. 6 is a configuration diagram illustrating a cooling passage of the electric vehicle of FIG. 5.

Here, the first heat sink 171 and second heat sink 181, as illustrated in FIG. 6, may be connected in parallel to the cooling fluid circulation circuit 210. More specifically, a first branch passage 261 and a second branch passage 271 may be formed on the cooling fluid circulation circuit 210, and the first heat sink 171 and second heat sink 181 may be connected to the first branch passage 261 and second branch passage 271, respectively.

A first valve 263 and a second valve 273 may be provided on the first branch passage 261 and second branch passage 271, respectively, to switch the relevant passage, and/or control a flow rate of the relevant branch passage.

Figure 7:
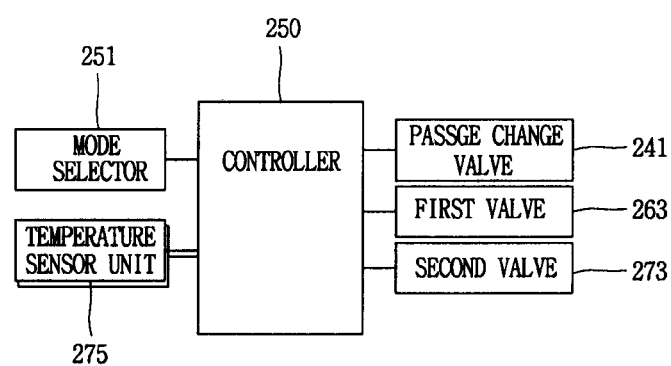
FIG. 7 is a control block diagram illustrating the electric vehicle of FIG. 5.

On the other hand, as illustrated in FIG. 7, a mode selector 251 and a passage change valve 241 may be controllably connected, respectively, to the controller 250 to change a passage according to the selected operation mode.

The first valve 263 and second valve 273 may be controllably connected, respectively, to the controller 250 to control a supply and/or a flow rate of the cooling fluid supplied to the first heat sink 171 and second heat sink 181.

The controller 250 may be configured to control a flow rate of the cooling fluid based on the temperature of the first heat sink 171 and second heat sink 181.

The controller 250 may be connected to a plurality of temperature sensor units 275, respectively, to detect the temperature of the first heat sink 171 and second heat sink 181, respectively.

By this configuration, the cooling fluid pumped by the pump 211 to flow through the radiator 225 or heater core 235 may be branched off and flowed into the first heat sink 171 and the second heat sink 181, respectively, along the first branch passage 261 and second branch passage 271.

The cooling fluid flowing into each passage of the first heat sink 171 and second heat sink 181 may exchange heat with the relevant heat sink 170 to cool the relevant heat sink 170, and then join and flow again.

The joined cooling fluid may perform a function of cooling the inside of the case 157 while being circulated along the cooling fluid circulation circuit 210.

On the other hand, the controller 250 may control a flow rate of the cooling fluid supplied to the first heat sink 171 and second heat sink 181 based on the temperature sensing result of the temperature sensor unit 275.

For example, when the temperature of the second heat sink 181 is lower than a preset temperature, the controller 250 may control the second valve 273 to reduce an amount of the cooling fluid supplied to the second heat sink 181 or suspend a supply of the cooling fluid for a predetermined period of time.

Hereinafter, still another embodiment of the present invention will be described with reference to FIGS. 8 through 10.

As described above, an electric vehicle having an inverter apparatus according to this embodiment may include a car body 110, a wheel 115 provided in the car body 110, an electromotor 130 configured to drive the wheel 115, a battery 140 provided in the car body 110, and an inverter apparatus 150 connected to the battery 140 and electromotor 130, respectively, to supply drive power to the electromotor 130.

Figure 8:
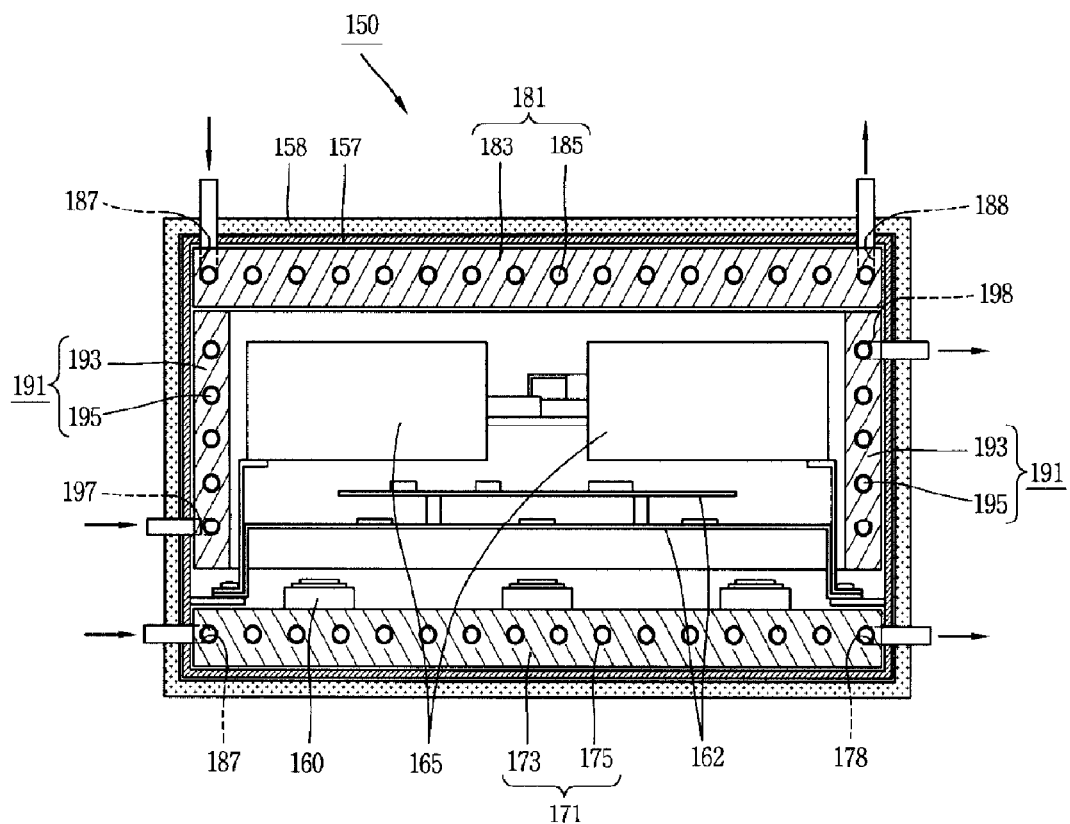
FIG. 8 is a cross-sectional view illustrating an inverter apparatus of an electric vehicle according to still another embodiment of the present invention.

As illustrated in FIG. 8, the inverter apparatus 150 may include a case 157, a switching element 160 disposed within the case 157, a first heat sink 171 provided with a cooling fluid passage therein and disposed to exchange heat with the switching element 160, a second heat sink 181 disposed to exchange heat with the first heat sink 171, and a third heat sink 191 disposed at an inner lateral surface of the case 157.

The case 157 may be formed with a rectangular parallelepiped provided with an accommodation space therein.

An insulating material 158 surrounding an outer surface of the case 157 may be provided at an outer portion of the case 157.

A switching element 160, a PCB 162, and a DC-link capacitor 165 may be provided, respectively, within the case 157.

The first heat sink 171 may be provided at a lower side of the switching element 160.

The second heat sink 181 may be provided at an inner upper region of the case 157.

On the other hand, the third heat sink 191 formed of a thermal conductive member and disposed at an inner lateral surface of the case 157 may be provided within the case 157. Due to this, it may be possible to more quickly cool an internal space of the case 157.

The third heat sink 191 may be disposed at least two surfaces of a lateral surface of the internal space of the case 157.

A passage may be formed within the third heat sink 191.

The third heat sink 191 may include a body 193 formed of a thermal conductive member, and a passage 195 formed within the body 193.

Here, the first heat sink 171, second heat sink 181, and third heat sink 191 may be formed to have cooling fluid inlets 177, 187, 197 and cooling fluid outlets 178, 188, 198, respectively.

Figure 9:
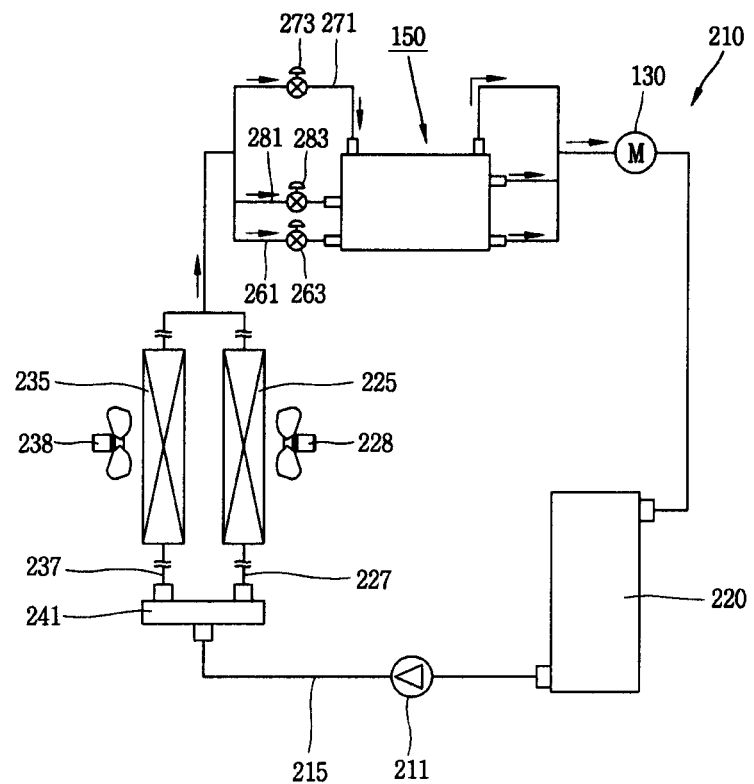
FIG. 9 is a configuration diagram illustrating a cooling passage of the electric vehicle of FIG. 8.

On the other hand, the first heat sink 171, second heat sink 181, and third heat sink 191, as illustrated in FIG. 9, may be connected in parallel to the cooling fluid circulation circuit 210. A first branch passage 261, a second branch passage 271, and a third branch passage 281 may be formed on the cooling fluid circulation circuit 210. The first heat sink 171, second heat sink 181, and third heat sink 191 may be connected to the first branch passage 261, second branch passage 271, and third branch passage 281, respectively.

A first valve 263, a second valve 273, and third branch passage 283 may be provided on the first branch passage 261, second branch passage 271, and third branch passage 281, respectively, to switch the relevant passage, and/or control a flow rate of the relevant branch passage.

Here, the first heat sink 171, second heat sink 181, and third heat sink 191, as illustrated in FIG. 9, may be configured such that the internal passages thereof are connected to one another in series by a connecting pipe 189.

Figure 10:
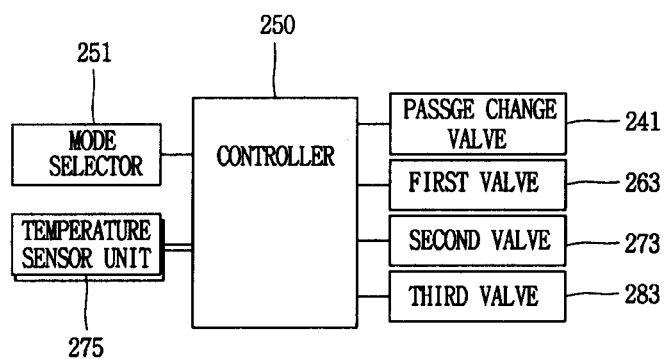
FIG. 10 is a control block diagram illustrating the electric vehicle of FIG. 8.

On the other hand, as illustrated in FIG. 10, a mode selector 251 and a passage change valve 241 may be controllably connected, respectively, to the controller 250 to change a passage according to the selected operation mode.

The first valve 263, second valve 273, and third valve 283 may be controllably connected, respectively, to the controller 250 to control a supply and/or a flow rate of the cooling fluid supplied to the first heat sink 171 through the third heat sink 191.

The controller 250 may be configured to control a flow rate of the cooling fluid based on the temperature of the first heat sink 171, second heat sink 181, and third heat sink 191.

The controller 250 may be connected to a plurality of temperature sensor units 275, respectively, to detect the temperature of the first heat sink 171, second heat sink 181, and third heat sink 191, respectively.

By this configuration, the cooling fluid pumped by the pump 211 to flow through the radiator 225 or heater core 235 may be branched off and flowed into the first heat sink 171, second heat sink 181, and third heat sink 191, respectively, along the first branch passage 261, second branch passage 271, and third branch passage 281.

The cooling fluid flowing into each passage of the first heat sink 171 and second heat sink 181 may exchange heat with the relevant heat sink to cool the relevant heat sink, and then join again.

The joined cooling fluid may perform a function of cooling the inside of the case 157 while being circulated along the cooling fluid circulation circuit 210.

On the other hand, the controller 250 may control a flow rate of the cooling fluid supplied to the first heat sink 171, second heat sink 181, and third heat sink 191 based on the temperature sensing result of the temperature sensor unit 275.

For example, when the temperature of the second heat sink 181 and third heat sink 191 is lower than a preset temperature, the controller 250 may reduce an amount of the cooling fluid supplied to the second heat sink 181 and third heat sink 191 or suspend a supply of the cooling fluid for a predetermined period of time.

Furthermore, when the temperature of the first heat sink 171 is higher than a preset temperature, the controller 250 may reduce a flow rate of the second heat sink 181 and third heat sink 191 or suspend a supply thereof, thereby more quickly cooling the first heat sink 171.

As described above, according to an embodiment of the present invention, a first heat sink and a second heat sink may be provided within a case of the inverter apparatus, wherein the first heat sink has a passage of the cooling fluid to quickly collect the heat generated by the components through the cooling fluid, thereby cooling the components as well as collecting thermal energy.

Furthermore, the heat generated by the components may be collected to be used in heating without being dissipated to the outside, thereby reducing battery consumption during heating.

Furthermore, the reduction of mileage due to heating may be suppressed, thereby extending a battery charge period.

In addition, a battery charge period that requires a lot of time for charging may be extended to reduce a waiting time for charging the battery to that extent, thereby facilitating the use of a vehicle.

As described above, specific embodiments of the present invention are illustrated and described herein. However, the present invention can be implemented in various embodiments without departing from the spirit or gist of the invention, and thus the foregoing embodiments should not be limited to the content of the detailed description.

Furthermore, the foregoing embodiments should be broadly construed within the scope of the technical spirit defined by the appended claims even though they are not specifically disclosed in the detailed description herein. Moreover, all changes and modifications within the technical scope of the claims and the equivalent scope thereof should be construed to be included in the appended claims.

What is claimed is:

1. An electric vehicle comprising:
a body;
a plurality of wheels provided at the body;
an electromotor to drive at least one wheel;
a battery provided in the body;
an inverter coupled between the battery and the electromotor, the inverter configured to convert direct current (DC) power to alternating current (AC) power;
a first heat sink to absorb heat within the inverter, the first heat sink including a first cooling fluid passage therein to allow cooling fluid to pass through and exchange heat with the first heat sink;
a second heat sink to absorb heat within the inverter, the second heat sink including a second cooling fluid passage therein to allow the cooling fluid to pass through and exchange heat with the second heat sink;
a third heat sink to absorb heat within inverter, the third heat sink including a third cooling fluid passage therein;
a controller to control the flow of the cooling fluid through the first cooling fluid passage of the first heat sink, the second cooling fluid passage of the second heat sink, and the third cooling fluid passage of the third heat sink; and
a cooling fluid circulation circuit coupling the first cooling fluid passage of the first heat sink, the second cooling fluid passage of the second heat sink, and the third cooling fluid passage of the third heat sink in parallel, the cooling fluid circulation circuit including a heater core to transfer heat from the cooling fluid to a passenger space of the body,
wherein the inverter comprises a case forming an inner space therein, the case insulated using an insulating material so as to suppress thermal energy within the case from being dissipated to an outside of the case,
wherein the inverter comprises at least one switching element, the first heat sink disposed at a lower side within the case so as to exchange heat with the at least one switching element,
wherein the second heat sink is disposed at an upper side within the case so as to exchange heat with air of the upper side within the case,
wherein the third heat sink is disposed at at least two sides within the case so as to exchange heat with air within the case, and wherein the controller controls the flow of the cooling fluid through the first cooling fluid passage of the first heat sink, the second cooling fluid passage of the second heat sink, and the third cooling fluid passage of the third heat sink.

2. The electric vehicle of claim 1, wherein the first heat sink is disposed to exchange heat with one or more elements of the inverter.

3. The electric vehicle of claim 1, further comprising:
a first temperature sensor to sense a temperature associated with the first heat sink; and
a second temperature sensor to sense a temperature associated with the second heat sink, wherein the controller detects the temperature associated with the first heat sink using the first temperature sensor and detects the temperature associated with the second heat sink using the second temperature sensor.

4. The electric vehicle of claim 3, wherein the controller reduces or suspends flow of the cooling fluid to the first cooling fluid passage when the controller detects that the temperature associated with the first heat sink is lower than a predetermined temperature, and the controller reduces or suspends flow of the cooling fluid to the second cooling fluid passage when the controller detects that the temperature associated the second heat sink is lower than a predetermined temperature.

5. The electric vehicle of claim 1, further comprising:
a first temperature sensor to sense a temperature associated with the first heat sink;
a second temperature sensor to sense a temperature associated with the second heat sink; and
a third temperature sensor to sense a temperature associated with the third heat sink, wherein the controller detects the temperature associated with the first heat sink using the first temperature sensor, detects the temperature associated with the second heat sink using the second temperature sensor, and detects the temperature associated with the third heat sink using the third temperature sensor.

6. The electric vehicle of claim 5, wherein the controller reduces or suspends flow of the cooling fluid to the first and second cooling fluid passages when the controller detects that the temperature associated with the third heat sink is higher than a predetermined temperature.

7. The electric vehicle of claim 5, wherein the controller reduces or suspends flow of the cooling fluid to the second and third cooling fluid passages when the controller detects that the temperature associated with the first heat sink is higher than a predetermined temperature.

8. The electric vehicle of claim 5, wherein the controller reduces or suspends flow of the cooling fluid to the first and third cooling fluid passages when the controller detects that the temperature associated with the second heat sink is higher than a predetermined temperature.

9. The electric vehicle of claim 1, further comprising a radiator, wherein the controller causes the cooling fluid to flow through at least one of the heating core and the radiator.

10. The electric vehicle of claim 9, wherein the controller controls between causing the cooling fluid to flow through the heater core and causing the cooling fluid to flow through the radiator in order to suppress a temperature of the cooling fluid from increasing beyond a predetermined temperature.

* * * * *